United States Patent
Dianbo

(10) Patent No.: US 8,212,604 B2
(45) Date of Patent: Jul. 3, 2012

(54) T SWITCH WITH HIGH OFF STATE ISOLATION

(75) Inventor: Guo Dianbo, Singapore (SG)

(73) Assignee: STMicroelectronics Asia Pacific Pte. Ltd., Singapore (SG)

(*) Notice: Subject to any disclaimer, the term of this patent is extended or adjusted under 35 U.S.C. 154(b) by 46 days.

(21) Appl. No.: 12/537,505

(22) Filed: Aug. 7, 2009

(65) Prior Publication Data

US 2011/0032021 A1 Feb. 10, 2011

(51) Int. Cl.
*H03K 17/687* (2006.01)
*H03K 17/16* (2006.01)

(52) U.S. Cl. ........ 327/389; 327/427; 327/434; 327/436; 327/534

(58) Field of Classification Search .................. 327/382, 327/389, 427, 434, 436, 534
See application file for complete search history.

(56) References Cited

U.S. PATENT DOCUMENTS

| | | | |
|---|---|---|---|
| 6,020,778 A * | 2/2000 | Shigehara et al. | 327/534 |
| 6,163,199 A * | 12/2000 | Miske et al. | 327/434 |
| 6,194,952 B1 * | 2/2001 | Shigehara | 327/534 |
| 6,567,024 B1 * | 5/2003 | Ishikawa | 341/136 |
| 6,605,977 B2 * | 8/2003 | Martini | 327/427 |
| 7,728,649 B1 * | 6/2010 | Webb et al. | 327/534 |
| 7,834,677 B2 * | 11/2010 | Yu | 327/391 |

FOREIGN PATENT DOCUMENTS

JP 01208910 A * 8/1989

* cited by examiner

*Primary Examiner* — Patrick O'Neil
(74) *Attorney, Agent, or Firm* — Wolf, Greenfield & Sacks, P.C.

(57) ABSTRACT

An analog T switch is disclosed which has high isolation in the off state. The analog T switch can include series-connected NMOS transistors having separate gate control. The gates of the NMOS transistors can be isolated from one another to improve off state isolation of the analog T switch. The analog switch can include series-connected PMOS transistors having separate gate control. The gates of the PMOS transistors can be isolated from one another to improve off state isolation of the analog T switch. The analog T switch can include a substrate voltage control circuit that controls the voltage of the substrate regions in which the PMOS transistors are formed. The substrate voltage control circuit can isolate the substrate regions of the PMOS transistors from one another in the off state to improve off state isolation of the analog T switch.

21 Claims, 5 Drawing Sheets

(Prior Art)

T SWITCH WITH HIGH OFF STATE ISOLATION

BACKGROUND OF THE INVENTION

1. Field of Invention

The techniques described herein relate generally to transistor switches, and more specifically to analog switches.

2. Discussion of the Related Art

Analog switches are commonly used circuit components that can provide great design flexibility at the system level. Various types of analog switches have been used.

FIG. 1A shows a first type of analog switch 10 that includes an NMOS transistor 1 and a PMOS transistor 2 in parallel between the input and output terminals of the analog switch 10. The input terminal of analog switch 10 is connected to the source terminal of the NMOS transistor 1 and the drain terminal of the PMOS transistor 2. The drain terminal of the NMOS transistor 1 and the source terminal of the PMOS transistor 2 are connected to the output terminal of the analog switch 10. The analog switch 10 is formed in a semiconductor substrate. The region of the substrate in which NMOS transistor 1 is formed is biased at ground voltage. The region of the substrate in which PMOS transistor 2 is formed is biased at voltage VDD. The configuration of analog switch 10 having parallel NMOS and PMOS transistors will be referred to herein as an "elemental analog switch." More complex analog switches can be formed using the elemental analog switch.

The gate 3 of the NMOS transistor 1 is driven by the NMOS gate control signal NG_CTL. The gate 4 of the PMOS transistor 2 is driven by the PMOS gate control signal PG_CTL. When the control signal NG_CTL is at voltage VDD and the control signal PG_CTL is at ground voltage, the analog switch 10 is turned on, and current can flow through the analog switch 10 between the input and output terminals. When the NMOS gate control signal NG_CTL is at a ground voltage and the PMOS gate control signal PG_CTL is at voltage VDD, the analog switch is turned off. The gate control signals NG_CTL and PG_CTL are complementary, such that control signal NG_CTL is at a low voltage level when control signal PG_CTL is at a high voltage level, and the control signal NG_CTL is at a high voltage level when the control signal PG_CTL is at a low voltage level. The NMOS transistor 1 is turned on when the control signal NG_CTL is at a high voltage level, allowing current to flow through the NMOS transistor between its source and drain terminals. The PMOS transistor 2 is turned on when the control signal PG_CTL is at a low voltage level, allowing current to flow through the PMOS transistor 2 between its source and drain terminals. Applying complementary control signals NG_CTL and PG_CTL to the gates of transistors 1 and 2 causes the transistors to be turned on at the same time and turned off at the same time. When the analog switch is in the on state, both NMOS transistor 1 and PMOS transistor 2 are turned on, allowing current to flow between the input and output terminals. When the analog switch is in the off state, both the NMOS transistor 1 and the PMOS transistor 2 are turned off, substantially preventing a signal from flowing between the input and output terminals of the analog switch. The presence of parasitic signal paths between the input and output terminals of the analog switch 10 does not allow the output terminal to be completely isolated from the input terminal when the analog switch 10 is in the off state. As a consequence, some of the signal present at the input terminal is coupled to the output terminal when the analog switch 10 is in the off state.

FIG. 1B shows the equivalent circuit 11 of the analog switch 10 when the analog switch 10 is in the off state. The equivalent circuit 11 is a high pass filter that includes a resistance R1 in parallel with a capacitor C1. R1 represents the resistance of the analog switch 10 in the off state, which can be in the range of megaohms or hundreds of kiloohms. C1 represents the capacitive coupling between the input and output nodes through parasitic signal paths. Due to the capacitive coupling, high frequency signals can propagate from the input terminal to the output terminal when the analog switch 10 is in the off state. The off state isolation for the analog switch 10 for a 1 MHz signal is about 45 dB.

There are five parasitic signal paths through analog switch 10 that couple the input terminal to the output terminal when the analog switch 10 is in the off state. The first path is through a parasitic capacitance between the input terminal and the gate 3 of the NMOS transistor 1, and through the parasitic capacitance between gate 3 and the output terminal. FIG. 2A shows the equivalent circuit for this first path, which includes the two parasitic capacitances and a shunt resistance Rp1 to ground. Rp1 is the on-resistance of the control circuit (not shown) that generates the NMOS gate control signal NG_CTL. The second path is through the parasitic capacitance between the input terminal and the region of the substrate 5 in which the NMOS transistor 1 is formed, and through the parasitic capacitance between this region of the substrate 5 and the output terminal. FIG. 2B shows the equivalent circuit for the second path, which includes two parasitic capacitances and a shunt resistance Rp2 to ground. Rp2 is the resistance through the NMOS bulk substrate region and the metal connection to ground. The third path is through the parasitic capacitance between the input terminal and the gate 4 of the PMOS transistor 2, and through the parasitic capacitance between gate 4 and the output terminal. FIG. 2C shows the equivalent circuit for the third path, which includes two parasitic capacitances and a shunt resistance Rp3 to VDD. Rp3 is the on-resistance of the control circuit (not shown) that generates the PMOS gate control signal PG_CTL. The fourth path is through the parasitic capacitance between the input terminal and the region of the substrate 6 in which the PMOS transistor 2 is formed, and through the parasitic capacitance between this region of the substrate 6 and the output terminal. FIG. 2D shows the equivalent circuit for the fourth path, which includes two parasitic capacitances and a shunt resistance Rp4 to VDD. Rp3 is the resistance through the PMOS bulk substrate region and the metal connection to terminal VDD. The fifth path is through the source-drain parasitic capacitances of the NMOS transistor 1 and the PMOS transistor 2. The fifth path is actually two separate paths: a path from the input terminal and the source terminal of the NMOS transistor 1 through the parasitic source-drain capacitance of the NMOS transistor 1 to the output terminal; and another path from the input terminal and the drain terminal of the PMOS transistor 2 through the parasitic source-drain capacitance of the PMOS transistor 2 to the output terminal. FIG. 2E shows the equivalent circuit for the fifth path, which is represented as a single capacitor representing the parallel combination of these paths through both the NMOS and PMOS transistors. These five parasitic signal paths allow coupling of the signal from the input terminal to the output terminal when the analog switch 10 is in the off state.

FIG. 3 shows another type of analog switch known as a T switch. T switch 30 includes two of the elemental analog switches 10 connected in series. T switch 30 includes an NMOS transistor 31 in parallel with a PMOS transistor 32 and an NMOS transistor 33 in parallel with a PMOS transistor 34. NMOS transistor 31 is in series with NMOS transistor 33 between the input and output terminals of the T switch 30.

PMOS transistor 32 is in series with PMOS transistor 34 between the input and output terminals of the T switch 30. The connection points between NMOS transistors 31 and 33 and PMOS transistors 32 and 34 are connected to each other and to an NMOS shunt transistor 35 that is connected to ground. The gates of the NMOS transistors 31 and 33 are driven by NMOS gate control signal NG_CTL and the gates of the PMOS transistors 32 and 34 are driven by PMOS gate control signal PG_CTL. The NMOS shunt transistor is also driven by control signal PG_CTL.

The T switch 30 has improved off state isolation compared to the elemental analog switch shown in FIG. 1A. When the T switch 30 is in the off state, the transistors 31-34 are turned off and the NMOS shunt transistor 35 is turned on. Turning on NMOS shunt transistor 35 couples the connection point of transistors 31-34 to ground, thereby shunting parasitic signals from the input terminal away from the output terminal of the T switch. The NMOS shunt transistor 35 can reduce the effects of the fifth parasitic signal path by coupling the connection point of transistors 31-34 to ground. In addition, NMOS transistors 31 and 33 are formed in regions of the substrate that have separate connections to ground, which reduces coupling through the second parasitic path. Similarly, PMOS transistors 32 and 34 are formed in regions of the substrate that have separate connections to VDD, which reduces coupling through the fourth parasitic path. These reductions in parasitic coupling provide improved off state isolation compared to the elemental analog switch. For example, the off state isolation of the T switch 30 for a 1 MHz signal can be 60 dB. One problem with T switch 30 is that it can have reduced linearity in the on state.

FIG. 4 shows a T switch 40 having a substrate voltage control circuit 41 that can improve the linearity of the T switch. When the T switch 40 is in the on state, the substrate voltage control circuit 41 controls the voltage of the regions of the substrate in which PMOS transistors 32 and 34 are located. The voltage of these regions is controlled based on the input signal applied to the input terminal of T switch 40.

The substrate voltage control circuit 41 includes two elemental analog switches in series between the input and output terminals of the T switch 40. Substrate voltage control circuit 41 includes an NMOS transistor 42 in parallel with a PMOS transistor 43 and an NMOS transistor 44 in parallel with a PMOS transistor 45. NMOS transistor 42 is in series with NMOS transistor 44 between the input and output terminals of the T switch 40. PMOS transistor 43 is in series with PMOS transistor 45 between the input and output terminals of the T switch 40. The NMOS transistors 42 and 44 and PMOS transistors 43 and 45 are connected to each other and to a PMOS shunt transistor 46, which is connected to voltage VDD. The regions of the substrate in which NMOS transistors 42 and 44 are formed are biased at ground voltage. The regions of the substrate in which PMOS transistors 43 and 45 are formed are biased at voltage VDD. NMOS transistors 42 and 44 are driven by control signal NG_CTL and PMOS transistors 43 and 45 are driven by control signal PG_CTL. PMOS shunt transistor 46 is driven by control signal NG_CTL.

When the T switch 40 is in the on state, transistors 42-45 are turned on and PMOS shunt transistor 46 is turned off. The input signal flows through transistors 42-45. At the connection node of transistors 42-45, the input signal is applied to the regions of the substrate in which PMOS transistors 32 and 34 are formed, to improve linearity. When the T switch 40 is in the off state, transistors 42-45 and 31-34 are turned off, and transistor 46 is turned on. The connection point of transistors 42-45 and substrate regions of PMOS transistors 32 and 34 are coupled to voltage VDD through PMOS shunt transistor 46.

A problem with T switch 40 is that substrate voltage control circuit 41 reduces the isolation of the T switch in the off state. Substrate voltage control circuit 41 increases the parasitic coupling between the input and output terminals.

BRIEF DESCRIPTION OF DRAWINGS

In the drawings, each identical or nearly identical component that is illustrated in various figures is represented by a like reference character. For purposes of clarity, not every component may be labeled in every drawing. In the drawings.

DETAILED DESCRIPTION

The techniques described herein relate to improving the off isolation of a T switch. In some embodiments, separate gate control signals are provided to different NMOS transistors in the T switch. Although the separate NMOS gate control signals may have substantially the same waveform, they can be generated by different control circuits to isolate the NMOS transistor gates from one another. Isolating the NMOS transistor gates from one another can reduce parasitic coupling through the gates of the NMOS transistors, thereby improving the off isolation of the T switch. In some embodiments, separate gate control signals are provided to different PMOS transistors in the T switch. Although the separate PMOS gate control signals may have substantially the same waveform, they can be generated by different control circuits to isolate the PMOS transistor gates from one another. As with the NMOS transistors, isolating the PMOS transistor gates from one another can reduce parasitic coupling through the gates of the PMOS transistors, thereby improving the off isolation of the T switch.

Figure 5:
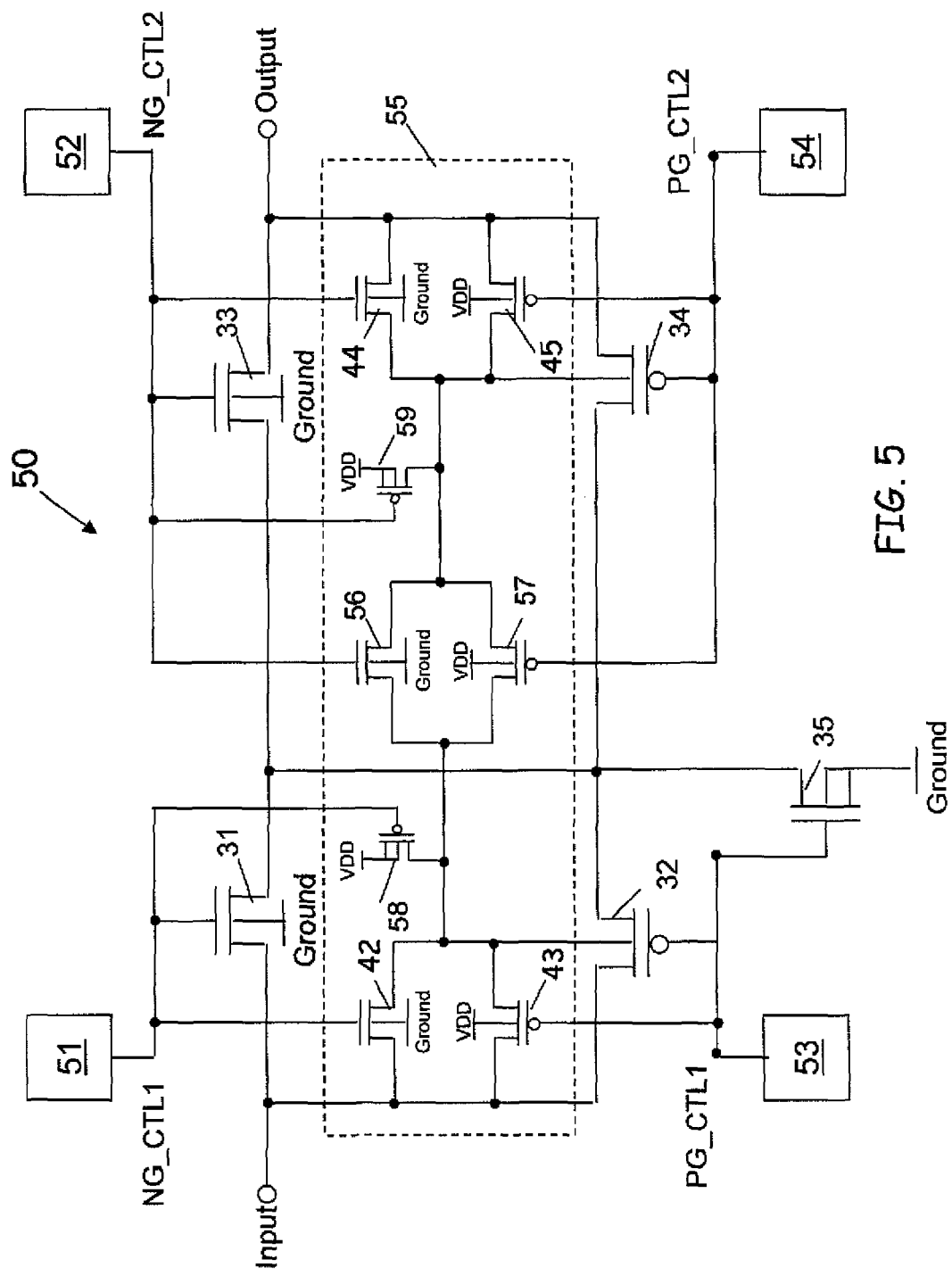
FIG. 5 shows an embodiment of a T switch having isolated gate terminals and a substrate voltage control circuit with improved isolation.

FIG. 5 shows an embodiment of a T switch 50 having improved off isolation. T switch 50 includes two elemental analog switches connected in series with one another. T switch 50 includes an NMOS transistor 31 in parallel with a PMOS transistor 32 and an NMOS transistor 33 in parallel with a PMOS transistor 34. NMOS transistor 31 is in series with NMOS transistor 33 to form a series path between the input and output terminals of the T switch 50. PMOS transistor 32 is in series with PMOS transistor 34 to form another series path between the input and output terminals of the T switch 50. NMOS transistors 31 and 33 are of a first conductivity type (i.e., NMOS) and PMOS transistors 32 and 34 are of another conductivity type (i.e., PMOS). The connection points between NMOS transistors 31 and 33 and PMOS transistors 32 and 34 are connected to each other and to an NMOS shunt transistor 35 that is connected to ground.

Figure 1A:
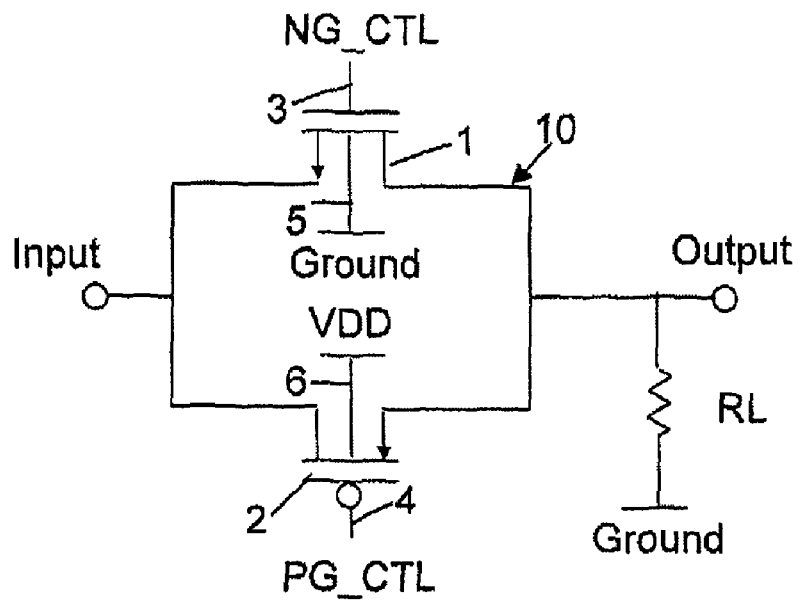
FIG. 1 shows an analog switch having parallel NMOS and PMOS transistors and its equivalent circuit.
Figure 1B:
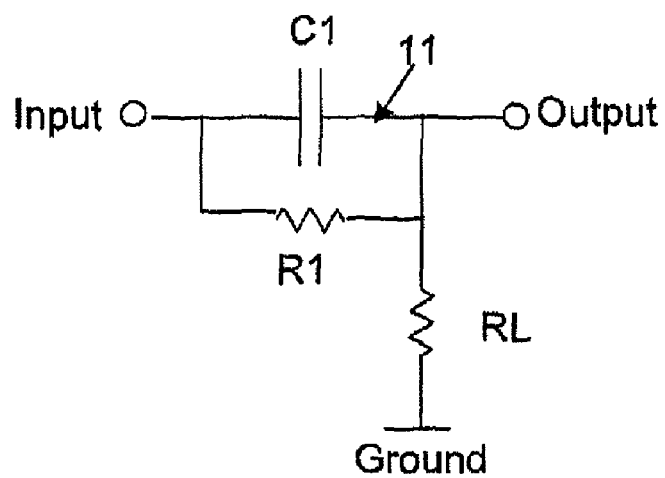
Figure 2A:
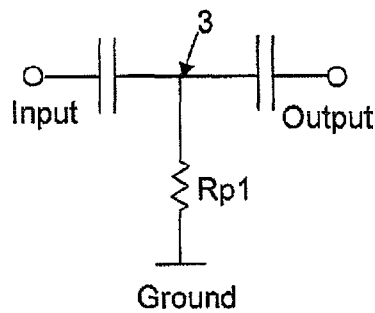
FIG. 2 shows equivalent circuits for five parasitic signal paths through the analog switch of FIG. 1, when the analog switch is in the off state.
Figure 2B:
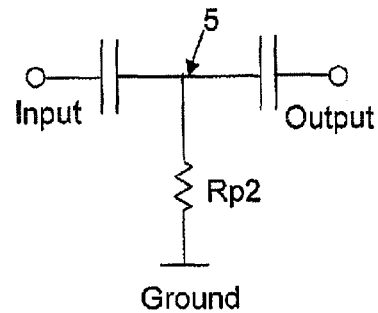
Figure 2C:
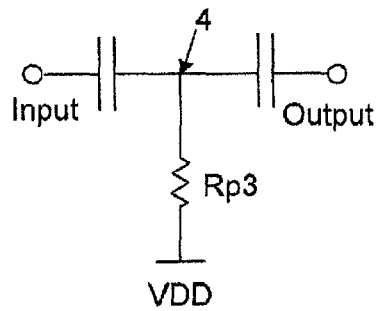
Figure 2D:
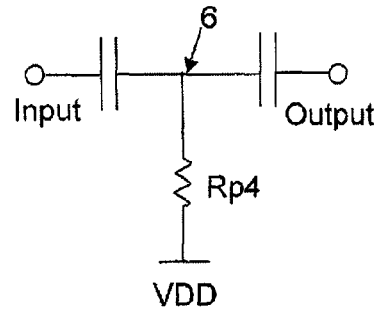
Figure 2E:
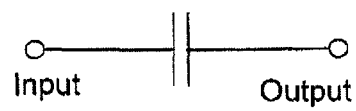
Figure 3:
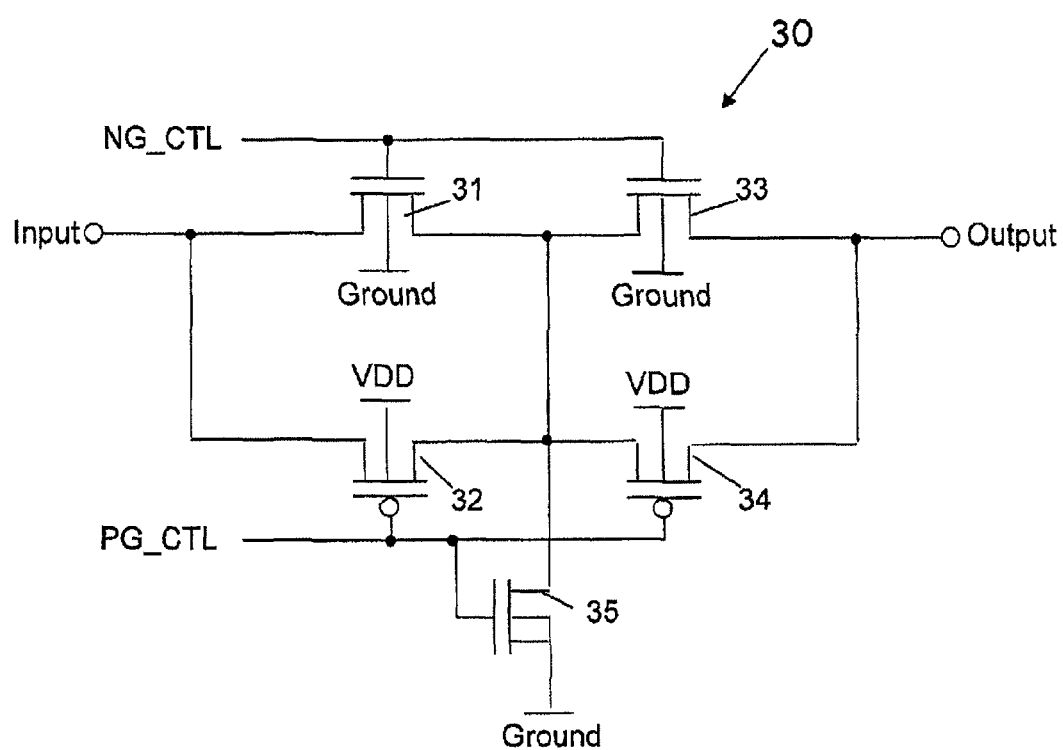
FIG. 3 shows a T switch having two of the analog switches of FIG. 1 and a shunt transistor.
Figure 4:
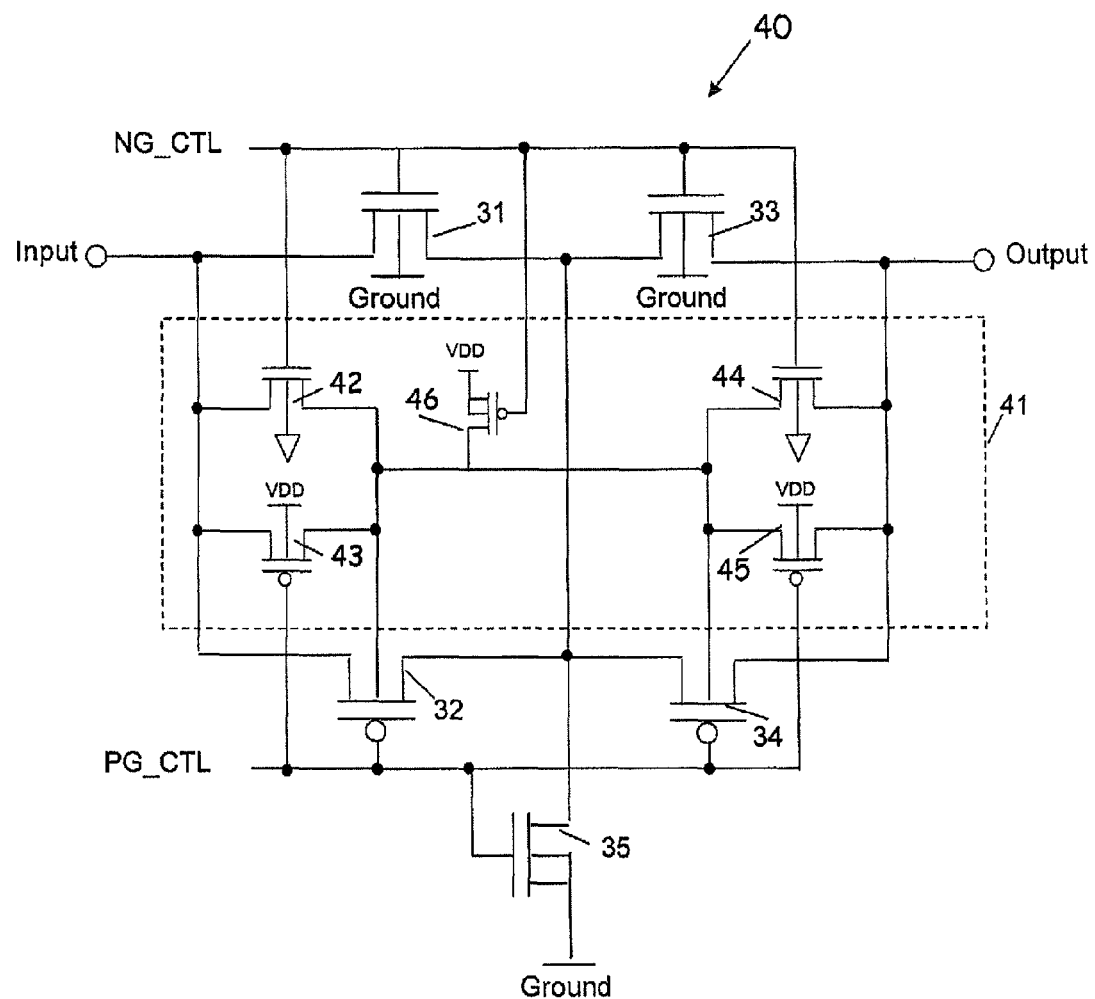
FIG. 4 shows a T switch having a substrate voltage control circuit to improve linearity.

In T switch 50, the gate of the NMOS transistor 31 is driven by the NMOS gate control signal NG_CTL1 which is generated by control circuit 51. The gate of the NMOS transistor 33 is driven by the NMOS gate control signal NG_CTL2 which is generated by control circuit 52. Control signals NG_CTL1 and NG_CTL2 may have substantially the same waveform, with the only difference between the two signals being that they are generated with different control circuits. The gates of NMOS transistors 31 and 33 are isolated from one another, thereby reducing the parasitic coupling between the input and output terminals of the T switch. This technique is in contrast to the T switches of FIGS. 3 and 4, in which the same control signal NG_CTL is provided to both NMOS transistors 31 and 33 from the same control circuit. When the gates of both NMOS transistors 31 and 33 are connected at the same node, a parasitic signal can propagate through the parasitic signal path from the input terminal through a parasitic capacitance to the gate terminal of NMOS transistor 31, through the common gate terminal, and then from the gate terminal of NMOS transistor 33 through a parasitic capacitance to the output terminal (similar to the first parasitic signal path discussed above). T switch 50 substantially reduces or eliminates this parasitic signal path by isolating the gate terminal of NMOS transistor 31 from the gate terminal of NMOS transistor 33.

Another improvement in off isolation can be achieved by isolating the gates of PMOS transistors 32 and 34 from one another. In T switch 50, the gate of the PMOS transistor 32 is driven by the PMOS gate control signal PG_CTL1 which is generated by control circuit 53. The gate of the PMOS transistor 34 is driven by the PMOS gate control signal PG_CTL2 which is generated by control circuit 54. Control signals PG_CTL1 and PG_CTL2 may have the substantially the same waveform, with the only difference between the two signals being that they are generated with different control circuits. Signals PG_CTL1 and PG_CTL2 may be complementary to signals NG_CTL1 and NG_CTL2. The gates of PMOS transistors 32 and 34 are isolated from one another, thereby reducing the parasitic coupling between the input and output terminals of the T switch. This technique is in contrast to the T switches of FIGS. 3 and 4, in which the same control signal PG_CTL was provided to both PMOS transistors 32 and 34 from the same control circuit. When the gates of both PMOS transistors 32 and 34 are connected at the same node, a parasitic signal can propagate through the parasitic signal path from the input terminal through a parasitic capacitance to the gate terminal of PMOS transistor 32, through the common gate terminal, and then from the gate terminal of PMOS transistor 34 through a parasitic capacitance to the output terminal (similar to the third parasitic signal path discussed above). T switch 50 substantially reduces or eliminates this parasitic signal path by isolating the gate terminal of PMOS transistor 32 from the gate terminal of PMOS transistor 34.

Any suitable type of control circuits may be used for control circuits 51-54, as the techniques described herein are not limited in this respect. The design and implementation of suitable control circuits will be understood by those of ordinary skill in the art.

In another aspect, T switch 50 includes a substrate voltage control circuit 55 that isolates the bulk substrate regions of the PMOS transistors 32 and 34 from one another when the T switch is in the off state. Isolating these regions can reduce the parasitic coupling through these regions of the substrate, thereby improving the off isolation of the T switch.

The substrate voltage control circuit 55 includes three elemental analog switches in series between the input and output terminals of the T switch 55. Substrate voltage control circuit 55 includes an NMOS transistor 42 in parallel with a PMOS transistor 43, an NMOS transistor 56 in parallel with a PMOS transistor 57, and an NMOS transistor 44 in parallel with a PMOS transistor 45. NMOS transistor 42 is in series with NMOS transistor 56 and NMOS transistor 44 between the input and output terminals of the T switch 50. PMOS transistor 43 is in series with PMOS transistor 57 and PMOS transistor 45 between the input and output terminals of the T switch 50. The connection points between NMOS transistors 42 and 56 and PMOS transistors 43 and 57 are connected to each other and to a PMOS shunt transistor 58 which is connected to voltage VDD. The connection points between NMOS transistors 56 and 44 and PMOS transistors 57 and 45 are connected to each other and to a PMOS shunt transistor 59 which is connected to voltage VDD. The regions of the substrate in which NMOS transistors 42, 44 and 56 are formed are biased at ground voltage. The regions of the substrate in which PMOS transistors 43, 45 and 57 are formed are biased at voltage VDD.

The gates of NMOS transistors 42 and 44 are driven by separate control signals and are isolated from one another to reduce parasitic coupling between the input and output terminals of the T switch 50. NMOS transistor 42 is driven by control signal NG_CTL1, which is generated by control circuit 51. NMOS transistor 44 is driven by control signal NG_CTL2, which is generated by control circuit 52. In this embodiment, the gate of NMOS transistor 56 is driven by control signal NG_CTL2, although it should be appreciated that NMOS transistor 56 can be driven by another control signal.

The gates of PMOS transistors 43 and 45 are driven by separate control signals and are isolated from one another to reduce parasitic coupling between the input and output terminals of the T switch 50. PMOS transistor 43 is driven by control signal PG_CTL1, which is generated by control circuit 53. PMOS transistor 45 is driven by control signal PG_CTL2, which is generated by control circuit 54. In this embodiment, the gate of PMOS transistor 57 is driven by PG_CTL2, although it should be appreciated that PMOS transistor 57 can be driven by another control signal.

When the T switch 50 is turned off, transistors 31-34, 42-45 and 56-57 are turned off, and transistors 35, 58 and 59 are turned on. The connection point of transistors 42, 43, 56 and 57 are coupled to voltage VDD through PMOS shunt transistor 58. The connection point of transistors 56, 57, 44 and 45 are coupled to voltage VDD through PMOS shunt transistor 59. The elemental analog switch formed of transistors 56 and 57 isolates the bulk substrate regions in which PMOS transistors 32 and 34 are formed, thereby increasing the off isolation of the analog T switch 50. This is in contrast to the T switch of FIG. 4, in which the substrate regions of PMOS transistors 32 and 34 are connected together by the substrate voltage control circuit 41. In T switch 40, a parasitic signal can propagate from the input terminal through a parasitic capacitance to the substrate region of PMOS transistor 32, through the common connection point of the substrate voltage control circuit 41 to the substrate region of PMOS transistor 34, and then though a parasitic capacitance to the output terminal (similar to the fourth parasitic signal path discussed above). T switch 50 substantially reduces or eliminates this parasitic signal path by isolating the substrate regions of PMOS transistors 32 and 34 from one another when the T switch 50 is in the off state.

When the T switch 50 is turned on, transistors 31-34, 42-45 and 56-57 are turned on and transistors 35, 58 and 59 are turned off. The signal at the input terminal is applied to the bulk substrate regions in which PMOS transistors 32 and 34 are formed, which can improve the linearity of the T switch 50 in the on state.

FIG. 5 shows an embodiment of a T switch that uses several different techniques for improving the off isolation. Although all of these techniques may be used together, in some embodiments a subset of one or more of these techniques may be used. For example, some T switch embodiments can use the technique of isolating the substrate regions of the PMOS transistors 32 and 34 and not use separate control signals for PMOS transistors 32 and 34. Other T switch embodiments can use the technique of using separate control signals for PMOS transistors 32 and 34 and not isolate the substrate regions of PMOS transistors 32 and 34. The techniques described herein can be used separately or in any suitable combination.

Having thus described some illustrative embodiments of the invention, it should be apparent to those skilled in the art that the foregoing is merely illustrative and not limiting, having been presented by way of example only. Numerous modifications and other embodiments may be used that fall within the scope of the invention.

Use of ordinal terms such as "first," "second," "third," etc. in the claims to modify a claim element or item in the specification does not by itself connote any priority, presence or order of one element over another. In addition, the use of an ordinal term does not by itself connote a maximum number of elements having a certain name that can be present in a claimed device or method. Any suitable number of additional elements may be used unless a claim requires otherwise. Ordinal terms are used in the claims merely as labels to distinguish one element having a certain name from another element having a same name. The use of terms such as "at least one" or "at least a first" in the claims to modify a claim element does not by itself connote that any other claim element lacking a similar modifier is limited to the presence of only a single element. Any suitable number of additional elements may be used unless a claim requires otherwise. The use of "including," "comprising," or "having," "containing," "involving," and variations thereof herein, is meant to encompass the items listed thereafter and equivalents thereof as well as additional items.

What is claimed is:

1. An analog switch that can be switched into an on state and an off state, the analog switch comprising:
    an input terminal;
    an output terminal;
    a first series path between the input terminal and the output terminal, the first series path comprising:
        a first transistor in a first semiconductor region;
        a second transistor in a second semiconductor region, the second transistor being in series with the first transistor; and
    an isolation circuit that isolates the first semiconductor region from the second semiconductor region when the analog switch is in the off state and couples the first semiconductor region to the second semiconductor region through a second series path separate from the first series path when the analog switch is in the on state, wherein the first series path is isolated from the second series path.

2. The analog switch of claim 1, further comprising:
    a third series path between the input terminal and the output terminal, the third series path comprising:
        a third transistor; and
        a fourth transistor in series with the third transistor.

3. The analog switch of claim 2, wherein the first and second transistors are PMOS transistors and the third and fourth transistors are NMOS transistors.

4. The analog switch of claim 2, wherein the isolation circuit comprises:
    a fifth transistor coupled between the first and second semiconductor regions, wherein the fifth transistor is an NMOS transistor; and
    a sixth transistor coupled between the first and second semiconductor regions, wherein the sixth transistor is a PMOS transistor in parallel with the fifth transistor.

5. The analog switch of claim 1, comprising a voltage control circuit that controls voltages of the first and second semiconductor regions when the analog switch is in the on state, wherein the voltage control circuit comprises:
    a first elemental analog switch coupled between the input terminal and the isolation circuit, the first elemental analog switch being coupled to the first semiconductor region; and
    a second elemental analog switch coupled between the isolation circuit and the output terminal, the second elemental analog switch being coupled to the second semiconductor region.

6. The analog switch of claim 5, wherein the first elemental analog switch comprises a fifth transistor of a first conductivity type and the second elemental analog switch comprises a sixth transistor of the first conductivity type, and wherein the gate of the fifth transistor is isolated from the gate of the sixth transistor.

7. The analog switch of claim 1, wherein the first transistor comprises a first gate and the second transistor comprises a second gate, wherein the first gate is isolated from the second gate.

8. The analog switch of claim 7, wherein a first control circuit generates a first control signal that drives the first gate and a second control circuit generates a second control signal that drives the second gate.

9. The analog switch of claim 8, further comprising:
    a third series path between the input terminal and the output terminal, the third series path comprising:
        a third transistor; and
        a fourth transistor in series with the third transistor;
        wherein a third control circuit generates a third control signal that drives a third gate of the third transistor and a fourth control circuit generates a fourth control signal that drives a fourth gate of the fourth transistor, wherein the third gate is isolated from the fourth gate.

10. The analog switch of claim 1, wherein the first and second semiconductor regions are positioned within a semiconductor substrate.

11. An analog switch, comprising:
    an input terminal;
    an output terminal;
    a first series path between the input terminal and the output terminal, the first series path comprising:
        a first transistor of a first conductivity type comprising a first gate, the first transistor being formed in a first semiconductor region;
        a second transistor of the first conductivity type in series with the first transistor, the second transistor comprising a second gate isolated from the first gate, the second transistor being formed in a second semiconductor region;
    a third transistor having a third gate, a first terminal coupled between the first transistor and the second transistor and a second terminal configured to be coupled to ground; and
    an isolation circuit that isolates the first semiconductor region from the second semiconductor region when the analog switch is in the off state and couples the first semiconductor region to the second semiconductor region through a second series path that is isolated from the first series path when the analog switch is in the on state, wherein a first control circuit drives the first gate and a second control circuit drives the second gate.

12. The analog switch of claim 11, further comprising:
a second series path between the input terminal and the output terminal, the third series path comprising:
a fourth transistor; and
a fifth transistor in series with the fourth transistor.

13. The analog switch of claim 12, wherein the first and second transistors are of a first conductivity type and the fourth and fifth transistors are of a second conductivity type.

14. The analog switch of claim 11, wherein the first control circuit drives the gate of the first transistor using a first control signal, wherein the second control circuit drives the gate of the second transistor using a second control signal, and wherein the first and second control signals are substantially the same.

15. The analog switch of claim 14, further comprising:
a third series path between the input terminal and the output terminal, the third series path comprising:
a fourth transistor; and
a fifth transistor in series with the fourth transistor;
wherein a third control circuit drives a fourth gate of the fourth transistor with a fourth control signal and a fifth control circuit drives a fifth gate of the fifth transistor with a fifth control signal, wherein the fourth gate is isolated from the fifth gate, and wherein the fourth and fifth control signals are substantially the same.

16. The analog switch of claim 15, wherein the first and second control signals are complementary to the fourth and fifth control signals.

17. The analog switch of claim 11, wherein the first and second semiconductor regions are positioned within a semiconductor substrate.

18. A method of operating an analog switch that can be switched into an on state and an off state, the analog switch comprising a first series path between an input terminal and an output terminal of the analog switch, the first series path comprising a first transistor in a first semiconductor region and a second transistor in a second semiconductor region, the method comprising:
switching the analog switch into the off state;
when the analog switch is in the off state, isolating the first semiconductor region from the second semiconductor region using an isolation circuit; and
when the analog switch is in the on state, coupling the first semiconductor region to the second semiconductor region through a second series path that is isolated from the first series path.

19. The method of claim 18, wherein the isolation circuit comprises a third transistor coupled between the first semiconductor region and the second semiconductor region, and wherein isolating the first semiconductor region from the second semiconductor region comprises turning off the third transistor.

20. The method of claim 19, further comprising:
when the analog switch is in the on state, turning on the third transistor to couple the first semiconductor region to the second semiconductor region.

21. The method of claim 20, further comprising:
driving a first gate of the first transistor with a first control signal; and
driving a second gate of the second transistor with a second control signal;
wherein the first gate is isolated from the second gate.

* * * * *

UNITED STATES PATENT AND TRADEMARK OFFICE
CERTIFICATE OF CORRECTION

PATENT NO.        : 8,212,604 B2                                    Page 1 of 1
APPLICATION NO.   : 12/537505
DATED             : July 3, 2012
INVENTOR(S)       : Dianbo Guo It is certified that error appears in the above-identified patent and that said Letters Patent is hereby corrected as shown below:

Col. 9, line 9, should read:
a third series path between the input terminal and the Signed and Sealed this
Fourteenth Day of August, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,212,604 B2 | Page 1 of 1 |
| APPLICATION NO. | : 12/537505 | |
| DATED | : July 3, 2012 | |
| INVENTOR(S) | : Dianbo Guo | |

It is certified that error appears in the above-identified patent and that said Letters Patent is hereby corrected as shown below:

On the title page, Item (75) should read:
(75) Inventor: Dianbo Guo, Singapore (SG)

Signed and Sealed this
Sixth Day of November, 2012

David J. Kappos
*Director of the United States Patent and Trademark Office*